(12) United States Patent
Lu

(10) Patent No.: US 7,658,865 B2
(45) Date of Patent: *Feb. 9, 2010

(54) CONDUCTING LIQUID CRYSTAL POLYMER MATRIX COMPRISING CARBON NANOTUBES, USE THEREOF AND METHOD OF FABRICATION

(75) Inventor: Minhua Lu, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 59 days.

This patent is subject to a terminal disclaimer.

(21) Appl. No.: 11/957,942

(22) Filed: Dec. 17, 2007

(65) Prior Publication Data

US 2009/0016027 A1 Jan. 15, 2009

Related U.S. Application Data

(63) Continuation of application No. 10/978,444, filed on Nov. 2, 2004, now Pat. No. 7,316,789.

(51) Int. Cl.
*C09K 19/38* (2006.01)
*C09K 19/54* (2006.01)
*H01L 23/373* (2006.01)
*C08K 3/04* (2006.01)

(52) U.S. Cl. .............. 252/299.01; 252/299.5; 252/500; 257/E23.101; 257/E23.103; 257/E23.11; 977/742; 977/753

(58) Field of Classification Search ........... 252/299.01, 252/299.5, 500; 428/1.1, 1.3; 257/E23.101, 257/E23.103, E23.11; 977/842, 858, 742, 977/753; 264/108

See application file for complete search history.

(56) References Cited

U.S. PATENT DOCUMENTS

| | | | |
|---|---|---|---|
| 5,213,868 | A | 5/1993 | Liberty et al. |
| 5,781,412 | A | 7/1998 | de Sorgo |
| 6,368,569 | B1 | 4/2002 | Haddon et al. |
| 6,900,264 | B2 | 5/2005 | Kumar et al. |
| 7,316,789 | B2 * | 1/2008 | Lu ............. 252/299.01 |
| 2003/0083421 | A1 | 5/2003 | Kumar et al. |
| 2005/0269726 | A1 | 12/2005 | Matabayas |

OTHER PUBLICATIONS

English abstract by Derwent for KR 2004092881 A (2004).*
"Phase Behavior and Rheology of SWNTs in Superacids", Davis et al., Macromolecules 2004, 37, pp. 154-160.
"Solution Properties of Single-Walled Carbon Nanotubes", Chen et al., Science, vol. 282, Oct. 2, 1998, pp. 95-98.
"Large-Scale Synthesis of Aligned Carbon Nanotubes" Li et al., Science, vol. 274, Issue 5293, 1701-1703, Dec. 6, 1996 (article and abstract downloaded from internet).
"Nanotubes Coil, Story Unfolds" Jacoby, C&EN Oct. 4, 1999, pp. 7-8.
"High Performance Electrolyte Gated Carbon Nanotube Transistors" Rosenblatt et al., J. Phys. Chem. B, vol. 105, No. 46, 2001.

* cited by examiner

*Primary Examiner*—Shean C Wu
(74) *Attorney, Agent, or Firm*—Connolly Bove Lodge & Hutz LLP; Louis J. Percello, Esq.

(57) ABSTRACT

Conducting liquid crystal polymer matrix comprising carbon nanotubes aligned in the matrix is provided, along with use thereof and method of fabrication.

12 Claims, 1 Drawing Sheet

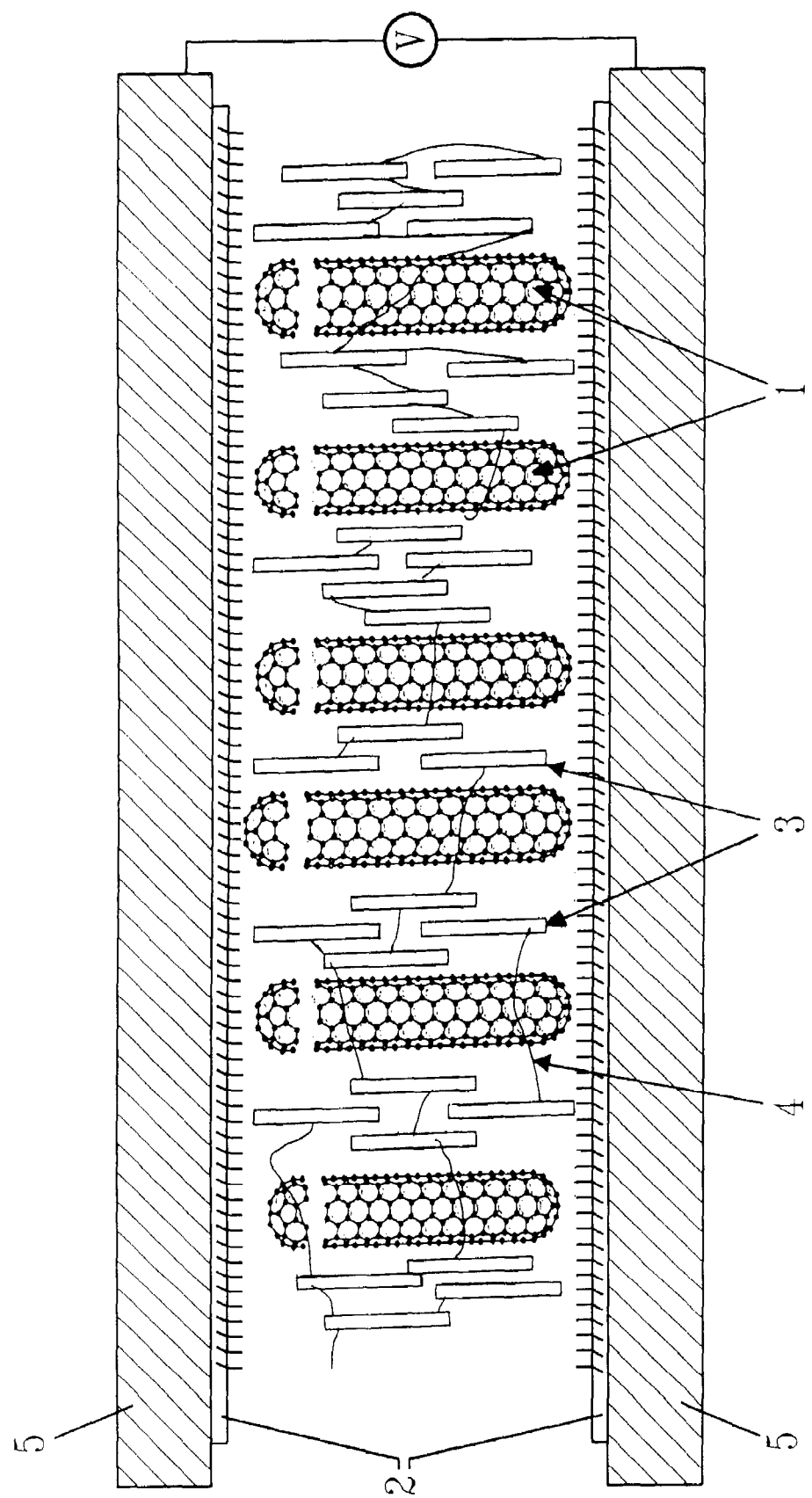

CONDUCTING LIQUID CRYSTAL POLYMER MATRIX COMPRISING CARBON NANOTUBES, USE THEREOF AND METHOD OF FABRICATION

CROSS REFERENCE TO RELATED APPLICATIONS

This application is a Continuation of co-pending application Ser. No. 10/978,444, filed on Nov. 2, 2004, and for which priority is claimed under 35 U.S.C. §120; the entire contents of all are hereby incorporated by reference

BACKGROUND

1. Technical Field

The present disclosure relates to carbon nanotubes and more particularly to aligned carbon nanotubes. According to the present disclosure, conducting liquid crystal polymers are used to disperse and align the carbon nanotubes. The aligned carbon nanotubes of this disclosure can be used in the field of packaging of electronic devices, and more specifically as thermal interface materials for thermal management and cooling of semiconductor devices.

2. Description of Related Art

Thermal management is of great importance to the operation of electronic devices. Thermal management is especially important in the operation of semiconductors as factors such as increasing operating frequencies push power consumption, and therefore heat generation, to the limits of the cooling capacity of traditional passive, air-cooled, heat sink technology. The power density ($W/cm^2$) in semiconductor devices continues to increase as the circuit density and operating frequency increase. Thermal management includes the skill of dissipating the heat generated by an electronic device away from the device and allowing the generated heat to disperse to its surroundings, while maintaining the semiconductor device at as low a temperature as possible. Insufficient transfer of heat away from an electronic device can result in performance and reliability degradation of that device or circuit due to an unacceptably high operating temperature.

Typical thermal management solutions use some combination of aluminum or copper heat sinks, fans, thermal spreaders/heat pipes, and thermal pastes or adhesives (TIMS) to form a low thermal resistance path between the semiconductor chip and the ambient.

In order to achieve an acceptable operating temperature for the chip, it is necessary to minimize the total thermal resistance (° C./W) from the chip to the ambient. Thermal interface material (TIM) which is the interface media between chip and heat spreader or heat sink is one of the bottle necks in thermal management. The TIM layers provide mechanical compliance to relieve the thermal expansion mismatch stress between the components that are constructed of different materials, but they also represent a significant portion of the total thermal resistance.

Thermal paste is one of the most common thermal interface material. It is a thick paste of conducting particles in oil or other low thermal conductivity media. Due to the interface resistance, the thermal conductivity of the paste is in the order of 1 W/mK. Thermal adhesive is another type of thermal interface material. The advantage of the thermal adhesive is that it serves both functions of thermal conduction and adhesion. Silicone and thermal epoxy are commonly used thermal adhesives. Metal or ceramic fillers are dispersed within a polymer binder to increase the thermal conductivity. Typical fillers are aluminum, silver, aluminum nitride, boron nitride, magnesium oxide, and zinc oxide. The typical polymer binder materials include silicone, urethane, thermoplastic rubber, and other elastomers. However, the thermal conductivity of the thermal adhesives are less than a few tens of W/mK. For instance see U.S. Pat. Nos. 5,781,412 and 5,213,868.

To further reduce the thermal resistance, a thin and high thermal conductivity material is needed. Carbon nanotubes (CNT) have very high thermal conductivity of >2000 W/mK. Many attempts of using CNT as fillers for thermal interface material have been made. It has been reported that by mixing 1% (in volume) of CNT in liquid, e.g. oil, the thermal conductivity of the suspension is 2.5 times of the thermal conductivity of the pure oil. However, further increasing the CNT concentration, only results in increasing the thermal conductivity minimally. It is believed that the entanglement of the CNT at higher concentrations and the high contact resistance between the tubes are the part of the cause.

Dissolution of CNT has been studied by Hadden (see U.S. Pat. No. 6,368,569 B1 and Science 282, pgs. 95-98, 1998). A self-assembled poly-domain nematic phase of the high concentration CNT in super acid solution has been obtained by Davis (see Macromolecules 37 pgs. 154-160, 2004). Vertically growing CNT on a substrate vertically by CVD has been demonstrated by Li et al (see Science 274, pg. 1701, 1996). However, the process is expensive and it is difficult to achieve on larger substrates.

SUMMARY

In this disclosure, conducting liquid crystal polymer (LCP) is used as the media to disperse and align the carbon nano tubes (CNT). The conducting LCP is reported to have thermal conductivity of 10-50 W/mK, which is about 100 times higher than oil, 0.15 W/mK. The ordered nature of the liquid crystalline phase can align the CNTs and improve the thermal conductivity. Aligned CNT should be able to increase the concentration of the CNT and the contact area between CNT, therefore decrease the interface resistance and increase the bulk thermal conductivity.

One embodiment of the present disclosure relates to a liquid crystal polymer matrix comprising carbon nanotubes aligned in the matrix.

Another aspect of this disclosure relates to a structure comprising the liquid crystal polymer matrix comprising carbon nanotubes aligned in the matrix located between opposed layers.

A still further aspect of this disclosure relates to a microelectronic device comprising an integrated chip and heat spreader or heat sink and the above disclosed structure located between the chip and heat spreader or heat sink.

A still further aspect of this disclosure relates to a microelectronic device comprising an integrated chip and heat spreader or heat sink and the above disclosed structure located between the chip and heat spreader or heat sink. Another aspect of this disclosure is a method for fabricating a structure that comprises a conducting liquid crystal polymer matrix comprising carbon nanotubes aligned in the matrix wherein the liquid crystal polymer matrix is between opposed surfaces, and wherein the method comprises mixing a conducting liquid crystal material with carbon nanotubes, bringing the mixture into smectic, nematic or isotropic liquid crystalline phase, applying a layer of the mixture onto opposing surfaces to be bonded. If desired, but not required, the mixture can be polymerized, which helps to lock in the CNT orientation and to adhere the two surfaces together.

Other objects, features, and advantages of the present disclosure will become apparent from the following detailed description. It should be understood; however, that the detailed description and specific examples, while indicating preferred embodiments of the present invention, are given by way of illustration only and various modifications may naturally be performed without deviating from the present disclosure.

BRIEF DESCRIPTION OF THE DRAWINGS

The FIGURE is a schematic diagram of conducting liquid crystal polymer matrix containing carbon nanotubes according to this disclosure.

DETAILED DESCRIPTION OF PREFERRED EMBODIMENTS

The present disclosure, according to preferred embodiments, overcomes problems with the prior art by dispersing and aligning carbon nanotubes within a conducting liquid crystal polymer matrix to reduce the thermal resistance of the structure.

In order to enhance the thermal conductivity of structures containing carbon nanotubes, conducting liquid crystal polymers are used as solvents to disperse and align the carbon nanotubes.

Aligned CNT should be able to increase the concentration of the CNT and the contact area between CNT, therefore increase the bulk thermal conductivity.

The conducting LCP is reported to have thermal conductivity of 10-50 W/mk, which is about 100 times higher than oil, 0.15 W/mk. The ordered nature of the liquid crystalline phase can align the CNTs and improve the thermal conductivity. Phonon scattering is low in ordered media, therefore the heat conduction is better.

The structures can be produced by mixing conducting liquid crystal monomers or oligomers with carbon nanotubes followed by bringing the mixture into smectic or nematic or isotropic liquid crystalline phase. A thin layer is applied into the surfaces to be joined and the surfaces are then brought together.

The structure is first heated up to isotropic phase, and the structure is slowly cooled down to nematic or smectic or crystalline phase. The rate of cooling is controlled so that the CNT will be aligned along with the liquid crystal polymers. The monomers and/or oligomers are polymerized to lock in the ordered phase. In place of monomers or oligomers, conducting liquid crystal polymers can be used at this stage which should better enhance thermal conductivity.

When the bonding surfaces are treated with homeotropic alignment agents, the liquid crystal will force CNT to alignment perpendicular to the surface. Once the matrix is fixed, it forms vertically aligned CNT layer that results high thermal conductivity between the bonded surfaces. The homeotropic alignment agents can be surfactant, such as a long chain alcohol, silane, lecithin or polyimide. The preferred liquid crystals are nematic or smectic liquid crystals with positive dielectric anisotropy. Polymer precursors are mixed with liquid crystal. An electric field between the two bonding surfaces can be applied during curing of the polymer to improve the alignment if the surfaces are conducting or coated with conducting films.

Furthermore, after the cure of the LCP, the CNTs are locked in the LCP matrix. The polymer matrix can be soft to conform to the surface contour and endure the thermal stress. Since the mixture before cure has low viscosity, the film can be as thin as a few microns. With the combination of high thermal conductivity, ultra thin film and good surface contact, the LCP with CNT can be used for thermal interface materials. Is typically about 2 microns to about 400 microns.

Some crosslinked polymers are produced during the polymerization. The amount of CNT in the matrix is typically at least about 0.5% by weight, more typically about 1 to about 10% by weight and even more typically about 1 to about 5% by weight.

Liquid crystal materials with positive dielectric anisotropy are available from Merck, Chiso.

Liquid crystal alignment agents include polyimides available from Nissan Chemical or Japan Synthetic Rubber, silane, lecithin, and hexadecyl trimethyl ammonium bromide (HTAB).

The FIGURE illustrates carbon nanotubes 1 aligned vertically between homeotropic alignment layers 2 located on substrates 5 and locked in a matrix of conducting liquid crystal polymers 3 and cross-linked conducting liquid crystal polymer 4.

According to one embodiment, conducting liquid crystal monomers or oligmers are mixed with carbon nanotubes, and the mixture is brought into smectic or nematic or isotropic liquid crystalline phase. A thin layer is applied into the surfaces to be joined together and the two surfaces are brought together. The temperature is controlled, by slowly cooling down from an isotropic phase (about 80 degree C. to about 180 degree or in some cases to about 300 degree C.) into a nematic or smectic or crystalline phase (about 50-200 degree C. depending on the material). The mixture is polymerized to lock in the ordered phase by either thermal or by a combination of UV and thermal polymerization. The thermal conductivity could be further improved by using conducting liquid crystal polymers.

According to another embodiment, the bonding surfaces are treated with homeotropic alignment agents, and the liquid crystal forces CNT to alignment perpendicular to the surface. Once the matrix is fixed, it forms a vertically aligned CNT layer that results in high thermal conductivity between the bonded surfaces. The homeotropic alignment agents can be a surfactant, long chain alcohol or polyimide, for example. The preferred liquid crystals are nematic or smectic liquid crystals with positive dielectric anisotropy. Polymer precursors are mixed with liquid crystal material with BAB-6(Bis[6-(acryloyloxy)hexyloxy]-1,1'biphenylene) from Merck being an example. An electric field between the two bonding surfaces can be applied during curing of the polymer to improve the alignment if the surfaces are conducting or coated with conducting films. The strength of the field is above Fredrick transition, which is about 1V/um to 20 V/um.

Experiments have shown that the certain alignment of the CNT can be obtained by mixing CNT into nematic liquid crystals. Although the quality of the alignment is somewhat limited due to the aggregation of the CNT, a certain degree of order is observed.

To disperse and disentangle the carbon nanotubes, solvents such as acetone, chloroform which dissolves liquid crystals can be used to disperse the CNTs before adding the liquid crystal or liquid crystal polymer. Heating, ultrasonic shaking and stirring can be used to break the entanglement of the CNTs. After the CNT are evenly dispersed in the liquid crystal and solvent mixture, the solvent can be evaporated by heating the mixture to isotropic phase while stirring.

The surface of the CNT can be physically or chemically treated in order to reduce the interface resistance. The treatment can include an acid (such as sulfuric acid) or plasma treatment (Ar, N, O etc), or thin film coating (metal etc) on the CNTs.

The foregoing description illustrates and describes the disclosure. Additionally, the disclosure shows and describes only the preferred embodiments but, as mentioned above, it is to be understood that it is capable of use in various other combinations, modifications, and environments and is capable of changes or modifications within the scope of the invention concept as expressed herein, commensurate with the above teachings and/or the skill or knowledge of the relevant art. The embodiments described hereinabove are further intended to explain best modes known by applicant and to enable others skilled in the art to utilize the disclosure in such, or other, embodiments and with the various modifications required by the particular applications or uses thereof. Accordingly, the description is not intended to limit the invention to the form disclosed herein. Also, it is intended that the appended claims be construed to include alternative embodiments.

All publications and patent applications cited in this specification are herein incorporated by reference, and for any and all purposes, as if each individual publication or patent application were specifically and individually indicated to be incorporated by reference.

What is claimed as new and desired to be protected by Letters Patent is:

1. A structure comprising a conducting liquid crystal polymer matrix comprising carbon nanotubes aligned in the matrix located between opposed surfaces,
    wherein the amount of the carbon nanotubes in the matrix is at least about 0.5% by weight, and
    wherein the opposed surfaces are treated with a thin alignment layer.

2. The structure of claim 1, wherein the alignment is perpendicular to the opposed surfaces.

3. A structure comprising a conducting liquid crystal polymer matrix comprising carbon nanotubes aligned in the matrix located between opposed surfaces,
    wherein the amount of the carbon nanotubes in the matrix is about 1 to about 5% by weight, and
    wherein the opposed surfaces are treated with a thin alignment layer.

4. The structure of claim 3, wherein the alignment is perpendicular to the opposed surfaces.

5. A microelectronic device comprising an integrated chip and heat spreader or heat sink and a conducting liquid crystal polymer matrix comprising carbon nanotubes aligned in the matrix located between the chip and heat spreader or heat sink,
    wherein the amount of the carbon nanotubes in the matrix is at least about 0.5% by weight,
    wherein the liquid crystal polymer matrix is located between opposed layers, and wherein
    the opposed layers are treated with a thin alignment layer.

6. A microelectronic device comprising an integrated chip and heat spreader or heat sink, and a conducting liquid crystal polymer matrix comprising carbon nanotubes aligned in the matrix located between the chip and heat spreader or heat sink,
    wherein the amount of the carbon nanotubes in the matrix is about 1 to about 5% by weight,
    wherein the liquid crystal polymer matrix is located between opposed layers, and wherein
    the opposed layers are treated with a thin alignment layer.

7. The microelectronic device of claim 5, wherein the alignment is perpendicular to the opposed surfaces.

8. The microelectronic device of claim 6, wherein the alignment is perpendicular to the opposed surfaces.

9. The microelectronic device of claim 5, wherein the conducting liquid crystal polymer matrix contains crosslinked liquid crystal polymer.

10. The microelectronic device of claim 6, wherein the conducting liquid crystal polymer matrix contains crosslinked liquid crystal polymer.

11. The microelectronic device of claim 5, wherein the amount of the carbon nanotubes in the matrix is about 1 to about 10% by weight.

12. The structure of claim 1, wherein the amount of the carbon nanotubes in the matrix is about 1 to about 10% by weight.

* * * * *